United States Patent
Inoue et al.

(10) Patent No.: US 11,442,088 B2
(45) Date of Patent: Sep. 13, 2022

(54) MEASUREMENT DEVICE, TIME INFORMATION PROVISION DEVICE, MEASUREMENT DEVICE CONTROL METHOD, TIME INFORMATION PROVISION CONTROL METHOD, MEASUREMENT DEVICE CONTROL PROGRAM, AND TIME INFORMATION PROVISION CONTROL PROGRAM

(71) Applicant: Informetis Corporation, Tokyo (JP)

(72) Inventors: Yasuhiko Inoue, Tokyo (JP); Tomoyuki Ono, Tokyo (JP)

(73) Assignee: Informetis Corporation, Tokyo (JP)

( * ) Notice: Subject to any disclaimer, the term of this patent is extended or adjusted under 35 U.S.C. 154(b) by 0 days.

(21) Appl. No.: 17/117,639

(22) Filed: Dec. 10, 2020

(65) Prior Publication Data

US 2021/0102979 A1  Apr. 8, 2021

Related U.S. Application Data

(63) Continuation of application No. PCT/JP2019/015707, filed on Apr. 10, 2019.

(30) Foreign Application Priority Data

Jun. 12, 2018  (JP) .............................. JP2018-111751

(51) Int. Cl.
*G01R 22/10* (2006.01)
*G01R 19/25* (2006.01)
(Continued)

(52) U.S. Cl.
CPC ......... *G01R 22/10* (2013.01); *G01R 19/2513* (2013.01); *G01R 21/133* (2013.01); *G01R 22/061* (2013.01)

(58) Field of Classification Search
CPC .. G01R 22/10; G01R 19/2513; G01R 21/133; G01R 22/061; G01R 19/2509;
(Continued)

(56) References Cited

U.S. PATENT DOCUMENTS

| 4,612,617 A * | 9/1986 | Laplace, Jr. ......... G01R 21/133 702/60 |
| 4,884,021 A * | 11/1989 | Hammond ........... G01R 21/133 324/142 |
| 6,289,267 B1 * | 9/2001 | Alexander ............... H02H 3/00 700/286 |

(Continued)

FOREIGN PATENT DOCUMENTS

| JP | 56-158954 A | 12/1981 |
| JP | 2002-55129 A | 2/2002 |

(Continued)

OTHER PUBLICATIONS

International Search Report dated Jun. 25, 2019 in counterpart WIPO Publication WO 2019/239699 A1.

(Continued)

*Primary Examiner* — Tung X Nguyen
*Assistant Examiner* — Robert P Alejnikov, Jr.
(74) *Attorney, Agent, or Firm* — DLA Piper LLP (US)

(57) ABSTRACT

Sampling timings at a plurality of measurement points at which waveform data of a power line is sampled are easily synchronized to each other. A measurement device includes: a sampling unit configured to sample a waveform of at least one of a voltage and a current at a measurement point of a power line at a predetermined sampling timing; a processing unit configured to execute processing of the waveform sampled by the sampling unit; a time information acquisition unit configured to acquire time information from a time information provision device that is communicatively connected through a network; and an adjustment unit configured to adjust a processing timing of the processing on the basis of the time information acquired by the time information acquisition unit.

20 Claims, 10 Drawing Sheets

(51) Int. Cl.
*G01R 21/133* (2006.01)
*G01R 22/06* (2006.01)

(58) Field of Classification Search
CPC .. G01R 22/063; G01R 21/06; G02B 6/12009; G02F 1/2955
USPC .......................................................... 324/95
See application file for complete search history.

(56) References Cited

U.S. PATENT DOCUMENTS

| | | | |
|---|---|---|---|
| 6,292,717 B1* | 9/2001 | Alexander | G01R 19/2513 340/6.1 |
| 9,568,507 B2 | 2/2017 | Perry et al. | |
| 9,759,751 B1* | 9/2017 | Sethi | G06F 17/00 |
| 10,317,438 B2 | 6/2019 | Tadano | |
| 2002/0032535 A1* | 3/2002 | Alexander | G01R 21/133 702/64 |
| 2009/0322314 A1 | 12/2009 | Long et al. | |
| 2011/0208468 A1* | 8/2011 | Yamamoto | H02J 13/00034 702/118 |
| 2015/0293152 A1 | 10/2015 | Choi et al. | |
| 2015/0316592 A1 | 11/2015 | Minezawa et al. | |
| 2016/0238639 A1 | 8/2016 | Tadano | |
| 2018/0156886 A1 | 6/2018 | Lu et al. | |
| 2018/0172750 A1* | 6/2018 | Rajagopal | G01R 19/2513 |

FOREIGN PATENT DOCUMENTS

| | | |
|---|---|---|
| JP | 2003-315388 A | 11/2003 |
| JP | 2010-175413 A | 8/2010 |
| JP | 4649397 B2 | 3/2011 |
| JP | 2011-176933 A | 9/2011 |
| JP | 2015-097303 | 5/2015 |
| JP | 2015-203702 A | 11/2015 |
| JP | 2016-156695 A | 9/2016 |
| JP | 2017-96755 A | 6/2017 |
| JP | 6219401 B2 | 10/2017 |
| WO | 2014/112125 | 7/2014 |
| WO | 2015/063943 A1 | 5/2015 |

OTHER PUBLICATIONS

Notice of Reasons for Refusal dated Apr. 5, 2022, of counterpart Japanese Patent Application No. 2018-111751, along with an English translation.
The Extended European Search Report dated Feb. 22, 2022, of counterpart European Patent Application No. 19820022.2.
Notice of Reasons for Refusal dated Jul. 12, 2022, of counterpart Japanese Patent Application No. 2018-111751, along with an English translation.

* cited by examiner

MEASUREMENT DEVICE, TIME INFORMATION PROVISION DEVICE, MEASUREMENT DEVICE CONTROL METHOD, TIME INFORMATION PROVISION CONTROL METHOD, MEASUREMENT DEVICE CONTROL PROGRAM, AND TIME INFORMATION PROVISION CONTROL PROGRAM

TECHNICAL FIELD

The present disclosure relates to a measurement device, a time information provision device, a measurement device control method, a time information provision control method, a measurement device control program, and a time information provision control program.

BACKGROUND

In recent years, technologies for measuring a current flowing through a main trunk of a distribution board and separating and estimating a current flowing through each of electrical device have been proposed. It is a significant advantage that the power consumption of a facility can be ascertained for each of the devices when performing measurements on the main trunk of a distribution board.

For example, in Japanese Patent No. 6219401, a signal processing system that determines an operation status of each of electrical devices by using one position in a main trunk of a power line supplied from a power supply to a plurality of electrical devices as a measurement point and separating waveform data acquired by sampling waveforms of a current and a voltage at the measurement point at a predetermined waveform start point into waveform data of each device has been described. The separation of the waveform data can be performed by normalizing waveform data using a waveform start point as a start point and comparing the normalized data to a waveform pattern of each electrical device.

Meanwhile, in accordance with an increase in the number of electrical devices connected to a power line, there are instances when a plurality of measurement points at which waveform data of the power line is sampled are set, and a plurality of pieces of waveform data are arithmetically processed. For example, when an electrical device such as a power generation device using solar light, an electric vehicle or the like is connected to a main trunk, there are instances when noise generated from a power conditioner that performs power conversion such as frequency conversion is mixed into the main trunk. To cancel out noise that has been mixed into waveform data of the main trunk, it is effective to add a measurement position near the power conditioner and subtract waveform data near a noise generation source from the waveform data of the main trunk.

Power devices such as a power conditioner converting electric power generated by a power generation device, a smart meter and the like have processing functions to adjust and measure a power waveform. For this reason, there are instances when a plurality of measurement points of the waveform data can be set by using power devices having such processing functions as a measurement device that samples waveform data.

When waveform data measured at measurement points of a plurality of positions in a power line is calculated, it is necessary to synchronize waveform start points serving as a reference of a time axis for calculation by synchronizing sampling timings for sampling the waveform data between a plurality of measurement devices.

To synchronize the sampling timings, for example, a wired communication line having a high communication speed is disposed between the plurality of measurement devices, and operations of the measurement devices are controlled using a communication command having a short communication delay.

In addition, to synchronize sampling timings, an accurate internal clock may be disposed in each of the measurement devices, and the sampling operations may be synchronized with the internal clocks.

However, when a plurality of measurement devices are installed at distant places or are installed at isolated places such as inside and outside of a building or the like, there are instances when it is difficult to install a wired communication line. In radio communication, there are instances when a communication delay according to a communication situation or a processing delay according to a communication load occurs, and it is difficult to synchronize the sampling timings.

In addition, since an accurate internal clock is expensive, when the internal clock is disposed in each of the measurement devices, there are instances when a device cost rises.

It could therefore be helpful to provide a measurement device, a time information provision device, a measurement device control method, a time information provision control method, a measurement device control program, and a time information provision control program capable of easily synchronizing sampling timings at a plurality of measurement points at which waveform data of a power line is sampled.

SUMMARY

We thus provide:

(1) A measurement device includes: a sampling unit configured to sample a waveform of at least one of a voltage and a current at a measurement point of a power line at a predetermined sampling timing; a processing unit configured to execute processing of the waveform sampled by the sampling unit; a time information acquisition unit configured to acquire time information from a time information provision device that is communicatively connected through a network; and an adjustment unit configured to adjust a processing timing of the processing on the basis of the time information acquired by the time information acquisition unit.

(2) The time information acquisition unit may acquire at least a value of a clock of the time information provision device and a value of a zero-cross counter counting zero-cross points at which positivity/negativity of the waveform is inverted in the time information provision device as the time information.

(3) The time information acquisition unit may acquire the time information from the time information provision device sampling a waveform of at least one of a voltage and a current at another measurement point of the power line.

(4) The adjustment unit may adjust the processing timing using a zero-cross point at which positivity/negativity of the waveform is inverted as a reference.

(5) The processing unit may sample a waveform in the sampling unit.

(6) A time information provision device includes: a sampling unit configured to sample a waveform of at least one of a voltage and a current at a measurement point of a power line at a predetermined sampling timing; a processing unit configured to execute processing of the waveform sampled by the sampling unit; and a time information provision unit configured to provide time information based on a processing timing of the processing for a measurement device that is communicatively connected through a network.

(7) The time information provision unit may provide the time information for the measurement device sampling a waveform of at least one of a voltage and a current at another measurement point of the power line.

(8) The sampling unit may sample the waveform at a sampling timing using a zero-cross point at which positivity/negativity of the waveform is inverted as a reference.

(9) The processing unit may sample a waveform in the sampling unit.

(10) A measurement device control method causes a measurement device to execute: a sampling step of sampling a waveform of at least one of a voltage and a current at a measurement point of a power line at a predetermined sampling timing; a processing step of executing processing of the waveform sampled in the sampling step; a time information acquisition step of acquiring time information from a time information provision device that is communicatively connected through a network; and an adjustment step of adjusting a processing timing of the processing on the basis of the time information acquired in the time information acquisition step.

(11) A time information provision control method causes a time information provision device to execute: a sampling step of sampling a waveform of at least one of a voltage and a current at a measurement point of a power line at a predetermined sampling timing; a processing step of executing processing of the waveform sampled in the sampling step; and a time information provision step of providing time information based on a processing timing of the processing for a measurement device that is communicatively connected through a network.

(12) A measurement device control program causes a measurement device to execute: a sampling process of sampling a waveform of at least one of a voltage and a current at a measurement point of a power line at a predetermined sampling timing; a processing process of executing processing of the waveform sampled in the sampling process; a time information acquisition process of acquiring time information from a time information provision device that is communicatively connected through a network; and an adjustment process of adjusting a processing timing of the processing on the basis of the time information acquired in the time information acquisition process.

(13) A time information provision control program causes a time information provision device to execute: a sampling process of sampling a waveform of at least one of a voltage and a current at a measurement point of a power line at a predetermined sampling timing; a processing process of executing processing of the waveform sampled in the sampling process; and a time information provision process of providing time information based on a processing timing of the processing for a measurement device that is communicatively connected through a network.

Our measurement device can easily synchronize sampling timings at a plurality of measurement points at which waveform data of a power line is sampled by sampling a waveform of at least one of a voltage and a current at a measurement point of a power line at a predetermined sampling timing, executing processing of the sampled waveform, acquiring time information from a time information provision device that is communicatively connected through a network, and adjusting a processing timing of the processing on the basis of the acquired time information.

DETAILED DESCRIPTION

Hereinafter, a measurement device, a time information provision device, a measurement device control method, a time information provision control method, a measurement device control program, and a time information provision control program according to an example will be described in detail with reference to the drawings.

Figure 1:
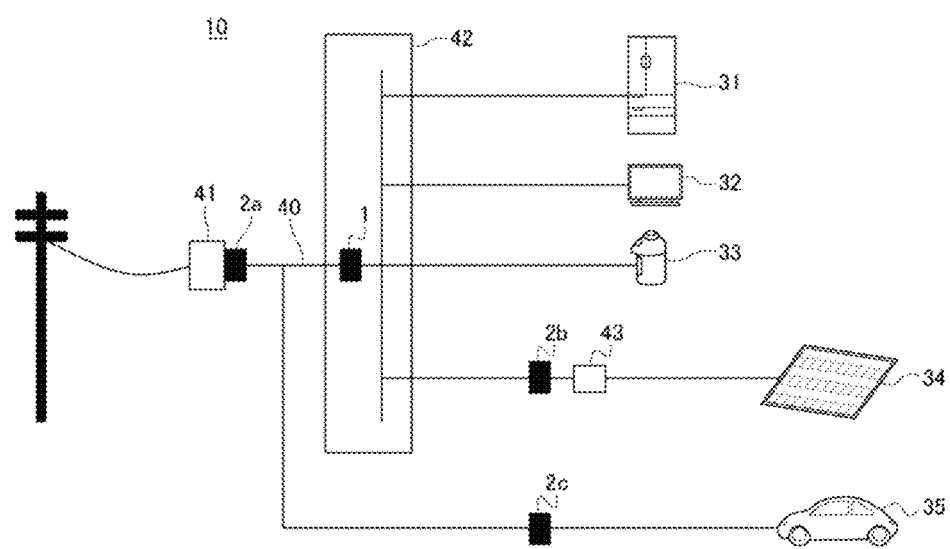
FIG. 1 is a block diagram illustrating an example of the configuration of a measurement system including a measurement device and a time information provision device.

First, a system configuration will be described with reference to FIG. 1. FIG. 1 is a block diagram illustrating an example of the configuration of a measurement system including a measurement device and a time information provision device.

In FIG. 1, the measurement system 10 includes the time information provision device 1 and the measurement device 2.

The time information provision device 1 is connected from a load side of a smart meter 41 of which a power supply side is connected to a power line (power supply) of a power company to a power supply side of a distribution board 42 in a main trunk 40 that is a power line connected to the power supply side of the distribution board 42. A casing of the time information provision device 1 is installed inside or near the distribution board 42. The time information provision device 1 measures a waveform of at least one of a voltage and a current at a measurement point disposed on the power supply side of the distribution board 42 in the main trunk 40. Details of the time information provision device 1 will be described later.

A measurement device 2a is installed inside or near the smart meter 41 and measures a waveform of at least one of a voltage and a current at a measurement point disposed on a load side of the smart meter 41. The smart meter 41 is a watthour meter that measures electric power supplied to a load side as a digital value and has a communication function inside the meter. The smart meter 41 can transmit digital data of a use status of measured electric power to a management server (not illustrated in the drawing) of a power company at predetermined time intervals using the communication function. The measurement device 2a measures a voltage or a current at the load side of the smart meter 41 and thus may use the function of the smart meter 41 for measuring a voltage and a current. For example, the measurement device 2a may be implemented as a function embodied by software of the smart meter 41. Details of the measurement device 2 including the measurement device 2a will be described later.

The distribution board 42 has a power supply side connected to the main trunk 40 and a load side connected to a plurality of wirings and distributes electric power of the power supply side to each of the wirings. The distribution board 42 may include an earth leakage circuit breaker that is not illustrated in the drawing, for cutting off electric leakage, a main trunk circuit breaker for cutting off a current of the main trunk, and a wiring circuit breaker for cutting off a current of each wiring. Each wiring of the load side is connected to a load side of the wiring circuit breaker installed for each wiring. Various electrical devices such as a refrigerator 31, a television set 32, and electric pot 33 presented as examples are connected to the wirings of the load side. The distribution board 42 may be a device having the function of the smart meter 41 or a function of a step-down transformer (for example, a cubicle-type high-voltage power receiving facility).

A power conditioner 43 and furthermore a photovoltaic power generator 34 are connected to the wiring of the load side of the distribution board 42 through the measurement device 2b. In addition, an electric vehicle 35 is connected to the wiring of the load side of a wiring circuit breaker that is not illustrated in the drawing, from the main trunk 40 through the measurement device 2c. The measurement device 2a and the measurement device 2c illustrated in FIG. 1 illustrate that a measurement point of the measurement device 2 can be disposed on the power supply side of the time information provision device 1 as an example. In addition, the measurement device 2b illustrates that a measurement point of the measurement device 2 can be disposed on the power supply side of the time information provision device 1 as an example.

The measurement device 2b is connected to a power line near the power conditioner 43 and measures a waveform of at least one of a voltage and a current at a measurement point that is a wiring near the power conditioner 43. In addition, the measurement device 2c is installed in a wiring connected to the electric vehicle 35 and measures a waveform of at least one of a voltage and a current at a measurement point that is a wiring connected to the electric vehicle.

The power conditioner 43 is an inverter that converts electric power generated by the photovoltaic power generator 34 from a DC to an AC of a commercial frequency (50 Hz or 60 Hz) and a commercial voltage (a single phase 200 V or a three phase 200 V). By supplying electric power generated by the photovoltaic power generator 34 to the distribution board 42, the power conditioner 43 can supply electric power to other wirings. The power conditioner 43 may be configured to supply electric power to a power line of a power company.

When the power conditioner 43 performs frequency conversion using an inverter, there are instances when switching noise is generated. The generated switching noise propagates through a power line while attenuating in accordance with the impedance of the power line. The measurement device 2b has the power line near the power conditioner 43 as a measurement point and thus can measure a waveform that strongly includes switching noise generated by the power conditioner 43.

In addition, the electric vehicle 35 includes an in-vehicle inverter that is not illustrated in the drawing, internally converting AC power supplied from the main trunk 40 into a DC. The DC power converted by the in-vehicle inverter is charged into an in-vehicle battery not illustrated in the drawing. On the other hand, the in-vehicle inverter can convert DC power charged into the in-vehicle battery into an AC and supply the AC to the distribution board 42. Similar to the power conditioner 43, there are instances when the in-vehicle inverter generates switching noise when frequency conversion is performed. The measurement device 2c has a wiring toward the electric vehicle 35 as a measurement point and thus can measure a waveform strongly including noise generated by the electric vehicle 35.

Although a configuration in which one time information provision device 1 and three measurement devices 2 (the measurement devices 2a, 2b, and 2c) are installed in the measurement system 10 illustrated in FIG. 1 has been described as an example, the number of installed time information provision devices 1 and the number of installed measurement devices 2 in the measurement system 10 are not limited thereto. For example, a plurality of time information provision devices 1 may be installed as a backup at the time of breakdown.

Although FIG. 1 illustrates a configuration in which the time information provision device 1 is installed inside or near the distribution board 42, the installation place of the time information provision device 1 is not limited thereto. For example, the time information provision device 1 may be installed inside or near the smart meter 41.

Figure 2:
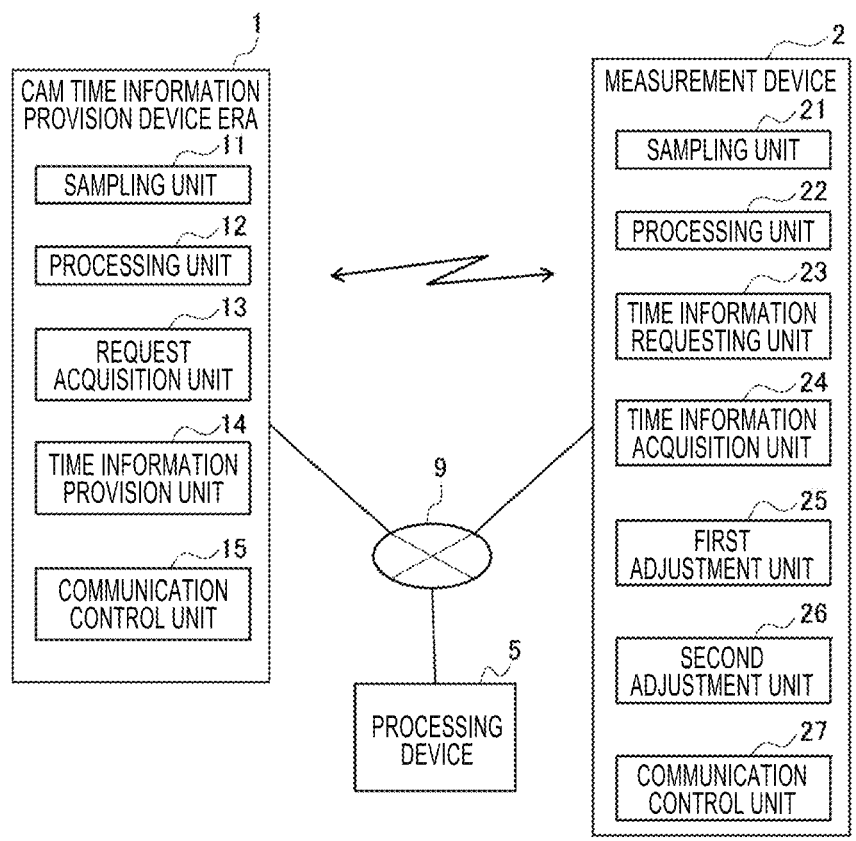
FIG. 2 is a block diagram illustrating an example of the software configuration of a time information provision device and a measurement device.

Next, functions of the time information provision device 1 and the measurement device 2 will be described with reference to FIG. 2. FIG. 2 is a block diagram illustrating an example of the software configuration of the time information provision device 1 and the measurement device 2. FIG. 2 illustrates when one measurement device 2 is installed.

As illustrated in FIG. 2, the time information provision device 1 is communicatively connected to the measurement device 2 through radio communication. A communication system between the time information provision device 1 and the measurement device 2 may be other than radio communication and, for example, may be power line communication through a power line, wired communication through a LAN cable, near field communication or the like.

The time information provision device 1 includes functional units of a sampling unit 11, a processing unit 12, a request acquisition unit 13, a time information provision unit 14, and a communication control unit 15. The measurement device 2 includes functional units of a sampling unit 21, a processing unit 22, a time information requesting unit 23, a time information acquisition unit 24, a first adjustment unit 25, a second adjustment unit 26, and a communication control unit 27. Each of the functional units of the time information provision device 1 according to this example will be described as a functional module that is embodied by a time information provision control program (software) controlling the time information provision device 1. In addition, each of the functional units of the measurement device 2 according to this example will be described as a functional module that is embodied by a measurement device control program (software) controlling the measurement device 2.

Time Information Provision Device 1

The sampling unit 11 executes sampling of a waveform of at least one of a voltage and a current at a measurement point in a power line at a predetermined sampling timing. The sampling unit 11 of the time information provision device 1 illustrated in FIG. 1 samples a waveform of a voltage or a current measured at a power supply side of the distribution board 42 in the main trunk 40 as a measurement point. The sampling unit 11, for example, samples a voltage waveform of 100 V to 200 V or 220 V to 240 V. In addition, the sampling unit 11 samples a current waveform in a current range corresponding to a cutoff current of the main trunk circuit breaker.

The sampling unit 11, for example, samples a waveform of a current or a voltage detected by a detection unit detecting a current or a voltage at a predetermined timing. In this example, a waveform start point in a sampling slot will be described as the predetermined timing as an example. Waveform data sampled by the sampling unit 11, for example, is analog data. Waveform data described in this example is not limited to either analog data or digital data.

The processing unit 12 executes processing of waveform data sampled by the sampling unit 11 in a plurality of processing slots. The processing slot is a processing unit of waveform data, and the processing is repeatedly executed with a predetermined period in synchronization with a waveform of a voltage or a current of a power supply. The processing slot is a processing unit that is executed n times with a period of one second (for example, n=10 or n=20), in other words, for 1/n seconds. For example, when a processing slot of n=20, one processing slot is executed for 0.05 seconds. The processing slot, for example, may be a processing unit that is set in accordance with a clock number of an internal clock. The processing unit 12 repeatedly executes n processing slots of slots 0 to (n−1) with a predetermined period (for example, one second).

Processing slots executed by the processing unit 12, for example, may include the following.

Sampling Slot

A sampling slot is a processing slot in which a process of sampling a waveform is executed in the sampling unit 11. In the sampling slot, the processing unit 12 causes the sampling unit 11 to execute sampling of a waveform at a "waveform start point." The waveform start point is a timing that is a start point for sampling a waveform in a sampling slot. For example, the waveform start point can be set in advance using a waveform of a voltage or a current detected in a sampling slot as a reference.

For example, when a sampling slot is executed for 0.05 seconds, a waveform of a power supply of which a commercial frequency is 50 Hz (a period is 0.02 seconds) is included 2.5 times (0.05/0.02=2.5) in the sampling slot. The processing slot is executed in synchronization with the waveform of the power supply. The waveform start point may be set as "a zero-cross point at which the polarity of the waveform changes from negativity to positivity for the first time in a sampling slot," "a zero-cross point at which the polarity of the waveform changes from positivity to negativity for the second time in a sampling slot" or the like. The zero-cross point is a timing at which positivity/negativity as the polarity of the waveform is inverted and can be easily detected. The waveform start point is synchronized with a waveform start point adjusted by the measurement device 2 to be described below. The zero-cross point can be easily detected and thus can be easily detected also by the measurement device 2 synchronized with the waveform start point, and therefore, the device cost can be reduced. In addition, by setting the zero-cross point as the waveform start point, sampled waveform data is a waveform having a zero point as a start point, and a process such as normalization of the waveform data and the like can be easily performed.

Other Processing Slots

As the other processing slots, the processing unit 12 can execute a conversion slot to convert an analog waveform sampled by the sampling unit 11 into a digital waveform (A/D conversion), an arithmetic operation slot to perform an arithmetic operation on the converted digital waveform, a processing slot to store waveform data of the calculated digital waveform, a transmission slot to transmit the calculated waveform data and the like. The conversion slot may be executed in the same processing slot as the sampling slot.

As an arithmetic operation of a digital waveform that is executed in the arithmetic operation slot, a normalization process of waveform data will be described below as an example.

As an example of the normalization process of waveform data, the processing unit 12 generates approximate waveform data of sampled analog waveform data from a waveform start point to a waveform end point, calculates a normalization period using the number of samples of the analog waveform data corresponding to one period and a waveform period, and further samples the approximate waveform data from the waveform start point with a normalization period. The waveform data for which the normalization process has been performed is used for a separation process for separation into waveform data for each electrical device. For example, a factorial hidden Markov model (HMM) may be used for the waveform data separation process. More specifically, first, model parameters modeling the operation status of each electrical device are prepared in advance. The waveform data is separated into a plurality of state variables for each time series using the factorial HMM. The separated state variables are compared with the model parameters prepared in advance, whereby an electrical device can be identified. A configuration in which the separation process described above is executed by a processing device 5 will be described below.

The request acquisition unit 13 acquires a request for provision of time information from the measurement device 2 that is communicatively connected through a network. The time information provision unit 14 provides time information based on a processing timing of processing in the processing slot in response to the request from the measurement device 2.

The time information is information used to synchronize the processing timing of the processing slot and is generated on the basis of an execution status of the processing slot of the time information provision device 1. For example, the time information is a slot number of the processing slot that is being executed by the time information provision device 1. When the number of processing slots is n, the slot number is an integer of one of 1 to n. When the period of the slot processing in the processing unit 12 is one second, and the number of slots is 20, the sampling slot is executed for 0.05 seconds. The processing of a slot having slot number 1 is executed for 0 to 0.05 seconds with 0 seconds set as a start time of the processing. In addition, the processing of a slot having slot number 2 is executed for 0.05 to 0.10 seconds. In other words, a slot number as the time information includes a time error of a maximum of 1/n seconds (when the period is one second). By using the time information, the waveform start point can be approximately synchronized in an error range of 1/n. Thus, even when communication between the time information provision device 1 and the measurement device 2 is delayed due to radio communication or the like, the influence of the communication delay can be ignored.

The communication control unit 15 controls radio communication with the measurement device 2. For example, the radio communication may be communication with the measurement device 2 through a wireless router that is not illustrated in the drawing. In addition, the communication control unit 15 controls communication with the processing device 5 through a network 9. The communication control unit 15 transmits digital waveform data processed by the processing unit 12 to the processing device 5.

The processing device 5 estimates operation statuses of electrical devices (the refrigerator 31, the television set 32, and the electric pot 33) on the basis of waveform data transmitted from the time information provision device 1 and the measurement device 2. The estimation of operation statuses can be executed, as described above, by separating waveform data into a plurality of state variables for each time series using the factorial HMM and comparing the state variables with the model parameters prepared in advance. The processing device 5 stores the model parameters of each of the electrical devices in advance. Since new electrical devices go on the market all the time, the processing device 5 may be configured to acquire model parameters of latest electrical devices, for example, from a cloud server not illustrated in the drawing.

Measurement Device 2

The sampling unit 21 samples a waveform of at least one of a voltage and a current at a measurement point in a power line at a predetermined sampling timing. The sampling unit 21 of the measurement device 2a illustrated in FIG. 1 samples a waveform of a voltage or a current measured at a power line of the output of the smart meter 41 as a measurement point. The sampling unit 21 of the measurement device 2b samples a waveform of a voltage or a current measured at a power line near the power conditioner 43 as a measurement point. In addition, the sampling unit 21 of the measurement device 2c samples a waveform of a voltage or a current measured at a power line wired in the electric vehicle 35 as a measurement point.

The sampling unit 21 samples the waveform of the current or the voltage, for example, detected by a detection unit detecting a current or a voltage at a waveform start point. A waveform data sampling process performed by the sampling unit 21 is the same as the waveform data sampling process performed by the sampling unit 11, and thus description thereof will be omitted.

The processing unit 22 executes the processing of waveform data sampled by the sampling unit 21 in a plurality of processing slots. A processing slot executed by the processing unit 22 is similar to the processing slot of the processing unit 12, and thus description thereof will be omitted. The process of communication control performed by the communication control unit 27 is the same as the process of the communication control performed by the communication control unit 15, and thus description thereof will be omitted.

The time information requesting unit 23 requests the time information provision device 1 that is communicatively connected through a network to provide time information. The time information acquisition unit 24 acquires time information provided from the time information provision device 1 in response to a request for provision of time information. The time information requesting unit 23 requests for provision of time information in a predetermined condition set in advance. The predetermined condition in which the provision of time information is requested is, for example, elapse of a predetermined time such as every one hour, execution of a processing slot a predetermined number of times, an operator's explicit operation such as pressing of a reset button of a device or the like. The time information acquisition unit 24 provides the acquired time information for the first adjustment unit 25.

The first adjustment unit 25 adjusts the processing timing of the processing in the processing slot on the basis of the time information acquired by the time information acquisition unit 24. The adjustment of a processing timing performed by the first adjustment unit 25 is processing of approximately synchronizing waveform start points in the error range of the processing time of processing slots (1/n) when n is the number of processing slots) on the basis of the time information. The second adjustment unit 26 adjusts the processing timing adjusted by the first adjustment unit 25 on the basis of the waveform. The second adjustment unit 26 performs processing of finely synchronizing the processing timings that are approximately adjusted by the first adjustment unit 25 on the basis of the waveforms of zero-cross points and the like.

The adjustment of processing timings of processing slots performed by the first adjustment unit 25 and the second adjustment unit 26 will be described with reference to FIGS. 3 to 5.

Figure 3A:
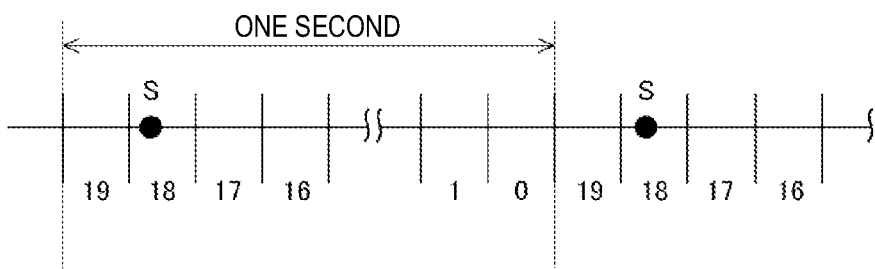
FIGS. 3(A) and 3(B) are diagrams illustrating an example of adjustment of processing timings of a measurement device.
Figure 3B:
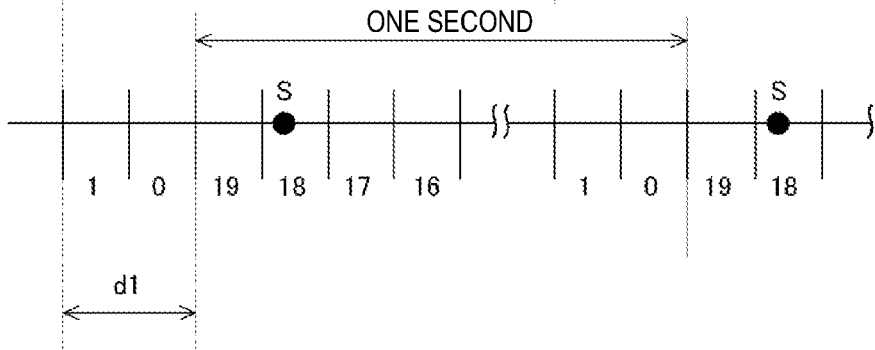

FIGS. 3(A) and 3(B) are diagrams illustrating an example of a time deviation between processing timings of processing slots of the time information providing device 1 and the measurement device 2. FIG. 3(A) is a timing diagram illustrating processing timings of processing slots of the time information provision device 1. FIG. 3(B) is a timing diagram illustrating processing timings of processing slots of the measurement device 2.

As illustrated in FIG. 3(A), the time information provision device 1 executes 20 processing slots having slot numbers 0 to 19 for one second. In other words, the processing time of one processing slot is 1/20=0.05 seconds. The processing slots are executed in order of slot numbers 19→18→17, and, after the processing slot having slot number 0 is executed, the processing slot having slot number 19 is executed again. The slot number 18 is a sampling slot. Black circles S in sampling slots represent timings of sampling of the waveform.

As illustrated in FIG. 3(B), similar to the time information provision device 1, the measurement device 2 executes 20 processing slots having slot numbers 0 to 19 for one second. The measurement device 2 executes processing slots with a delay time d1 with respect to the time information provision device 1. For this reason, the sampling timing of the waveform is also delayed by the delay time d1. Although the delay time d illustrated in FIG. 3 or 4 represents when the processing timing of the measurement device 2 is delayed to have a positive value, the delay time d may have a negative value representing that the processing timing of the measurement device 2 leads.

For example, a delay in the execution of a processing slot occurs immediately after input of power to the measurement device 2 (an unsynchronized state). In addition, a delay in the execution of a processing slot occurs when an internal clock of the measurement device 2 deviates from an internal clock of the time information provision device 1 (a state in which synchronization deviates over time). The measurement device 2 according to this example synchronizes processing timings of processing slots generated in such a state illustrated in FIG. 3.

This configuration synchronizes processing timings of sampling slots. Thus, in adjustment of processing timings performed by the first adjustment unit 25, processing slots other than sampling slots may be different from those of the time information provision device 1 or other measurement devices 2. In addition, even when the numbers of processing slots are different, and thus processing times of one processing slot are different, it is only required to be able to synchronize the processing timings of sampling slots.

Figure 4A:
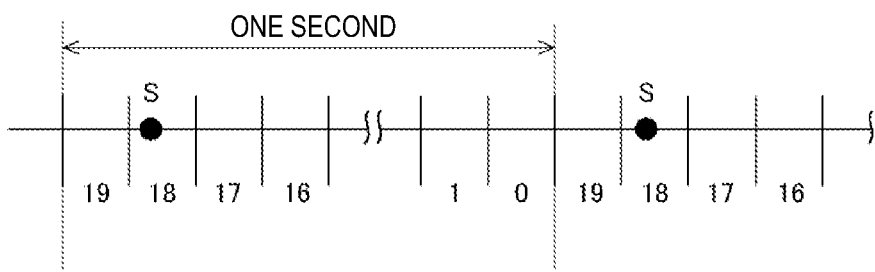
FIGS. 4(A) and 4(B) are diagrams illustrating an example of adjustment of processing timings of a measurement device.
Figure 4B:
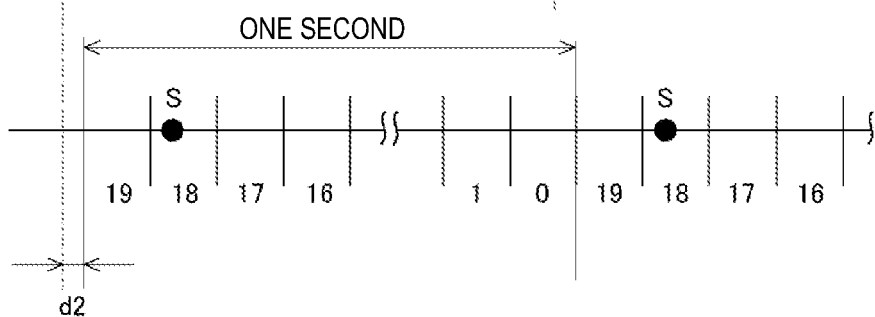

FIGS. 4(A) and 4(B) are diagrams illustrating an example of adjustment of processing timings of processing slots of the measurement device 2 which is performed by the first adjustment unit 25. FIG. 4(A) is a timing diagram illustrating processing timings of processing slots of the time information provision device 1. FIG. 4(B) is a timing diagram illustrating processing timings of processing slots of the measurement device 2 after adjustment performed by the first adjustment unit 25.

FIG. 4(A) is the same as FIG. 3(A), and thus description thereof will be omitted. FIG. 4(B) is a timing diagram after adjustment is performed such that a delay time d2 of processing timings is less than 1/20 (0.05) seconds that is a processing time of a processing slot by using time information. In other words, d2<0.05 seconds. The time information is information that represents a processing slot that is being executed by the time information provision device 1 and thus includes an error of 0.05 seconds in the time information of the time information requesting unit 23 in accordance with a request timing. The first adjustment unit 25 approximately adjusts processing timings including this error and thus ignores a delay time of communication at the time of acquisition of time information. In this way, an inexpensive communication means such as a wireless LAN or the like can be used in acquisition of time information.

Figure 5:
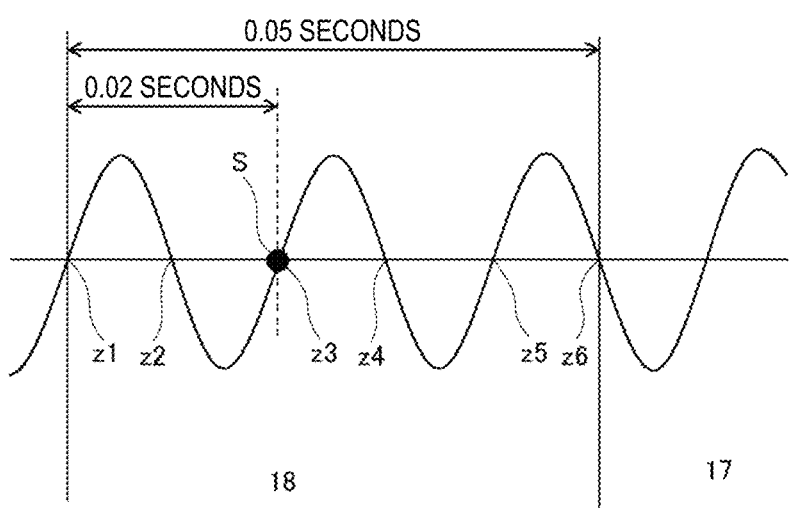
FIG. 5 is a diagram illustrating an example of adjustment of processing timings of a measurement device.

FIG. 5 is a diagram illustrating an example of adjustment of processing timings of the measurement device 2 that is performed by the second adjustment unit 26.

In FIG. 5, a sampling slot denoted by slot number 18 is executed in synchronization with a zero-cross point of the waveform of a commercial power supply. A processing time of a sampling slot is 0.05 seconds. When the frequency of the commercial power supply is 50 Hz, a waveform of 2.5 periods is included in one processing slot. When a processing timing of a processing slot is synchronized with a zero-cross point at which the polarity of the waveform is inverted from negativity to positivity, six zero-cross points z1 to z6 are included in a sampling slot. The second adjustment unit 26 can adjust the processing timing to a zero-cross point z1, z3, or z5.

When the second adjustment unit 26 sets the zero-cross point z3 as a processing timing, the processing timing is delayed by one period (0.02 seconds) of the power supply frequency. On the other hand, when the second adjustment unit 26 sets the zero-cross point z5 as a processing timing, the processing timing is delayed by two periods (0.04 seconds) (lead by a half period) of the power supply frequency. Such a delay can be detected by the first adjustment unit 25 acquiring time information at the start or the end of the sampling slot. In other words, when the processing timing is delayed by one period, time information acquired at the start of the sampling slot is time information having slot number 19. On the other hand, when the processing timing is delayed by two periods, time information acquired at the end of the sampling slot is time information having slot number 17.

The second adjustment unit 26 can synchronize the processing timings by changing the zero-cross point by the delayed period. By synchronizing the processing timings, the sampling timings denoted by black circles S can be synchronized with the time information provision device 1.

Each of the functional units described above included in the time information provision device 1 or the measurement device 2 represents one example of the functional unit included in each of the devices and is not intended for limiting the functions of each of the devices. For example, each of the devices does not need to include all the functional units described above and may include some of the functional units. In addition, each of the devices may have functions other than those described above.

Each of the functional units described above has been described as being embodied by software. However, at least one or more functional units among the functional units described above may be embodied by hardware.

Any one of the functional units described above may be divided into a plurality of functional units and be executed. In addition, any two or more of the functional units described above may be executed with being integrated into one functional unit. In other words, FIG. 2 represents functions of the measurement system 10 using functional blocks and, for example, does not indicate that each functional unit is composed of an individual program file.

Each of the devices may be a device that is embodied by one casing or a system that is embodied by a plurality of devices connected through a network or the like. For example, some or all of the functions of the measurement device 2 may be embodied by a virtual device such as a cloud service provided by a cloud computing system or the like. In other words, at least one or more functional units of the measurement device 2 among the functional units described above may be embodied by another other device. The measurement device 2 may be either a general computer such as a desktop PC or a dedicated device of which functions are limited.

Figure 6:
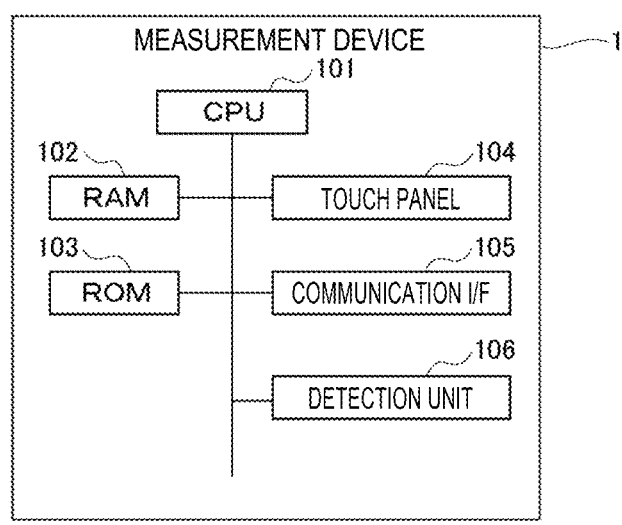
FIG. 6 is a block diagram illustrating an example of the hardware configuration of a measurement device.

Next, the hardware configuration of the measurement device 2 will be described with reference to FIG. 6. FIG. 6 is a block diagram illustrating an example of the hardware configuration of the measurement device 2. The hardware configuration of the time information provision device 1 may be a configuration similar to that of the measurement device 2.

The measurement device 2 includes a central processing unit (CPU) 101, a random access memory (RAM) 102, a read only memory (ROM) 103, a touch panel 104, and a communication interface (I/F) 105. The measurement device 2 is a device that executes the information processing program described with reference to FIG. 1.

The CPU 101 executes an information processing program stored in the RAM 102 or the ROM 103, thereby controlling the measurement device 2. A measurement device control program, for example, is acquired from a recording medium having a program recorded thereon, a program distribution server through a network or the like, is installed in the ROM 103, is read from the CPU 101, and is executed.

The touch panel 104 has an operation input function and a display function (operation display function). The touch panel 104 enables a user of the measurement device 2 to perform an operation input using a fingertip, a touch pen or the like. Although a configuration in which the measurement device 2 according to this example uses the touch panel 104 having the operation display function is described, the measurement device 2 may separately include a display device having a display function and an operation input device having an operation input function. In such a configuration, a display screen of the touch panel 104 can be configured as a display screen of the display device, and an operation on the touch panel 104 can be performed as an operation on the operation input device. The touch panel 104 may be embodied in various forms such as displays of a head-mount type, a glasses type, and a wrist watch type.

The communication I/F 105 is an I/F for communication. For example, the communication I/F 105 executes a wireless LAN, a wired LAN, or near field communication using infrared rays or the like. Although only the communication I/F 105 is illustrated as an I/F for communication in FIG. 6, the measurement device 2 may include communication I/Fs for communication using a plurality of communication systems.

A detection unit 106 detects analog waveform data of a current or a voltage of a power line. For example, the detection unit 106 can measure a voltage in the range of 100 V to 200 V or 220 V to 240 V. The detection unit 106 can measure a current of which an upper limit is a contract current. When the power supply is a single-phase three-wire type power supply, for example, the detection unit 106 may detect a total of three channels including two current channels and one voltage channel.

The hardware configuration illustrated in the drawing represents a part of the configuration of the device and is not for the purpose of limiting the hardware configuration. For example, the hardware configuration may include input devices such as a switch, a keyboard and the like, a display device such as an LED or the like, an audio output device such as a speaker and the like.

Figure 7:
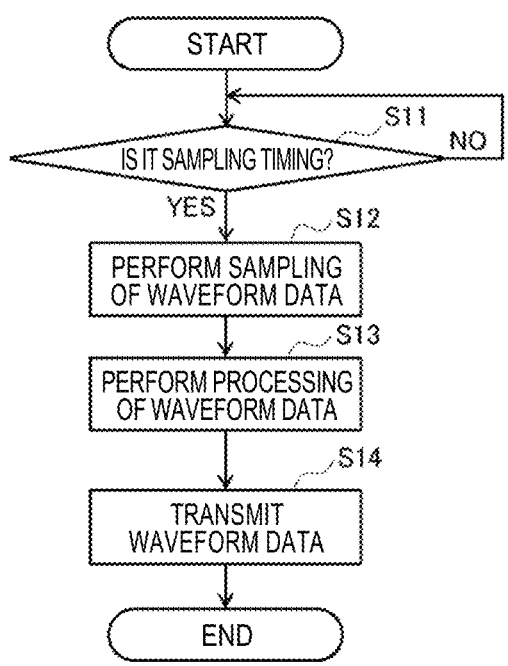
FIG. 7 is a flowchart illustrating an example of operations of a measurement device control program and a time information provision control program.
Figure 8:
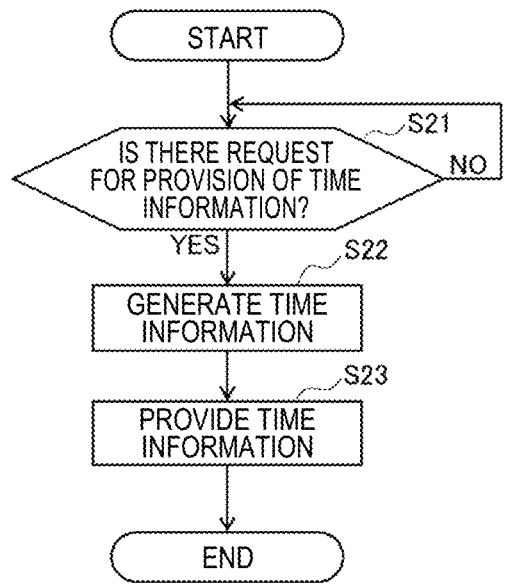
FIG. 8 is a flowchart illustrating an example of operations of a time information provision control program.
Figure 9:
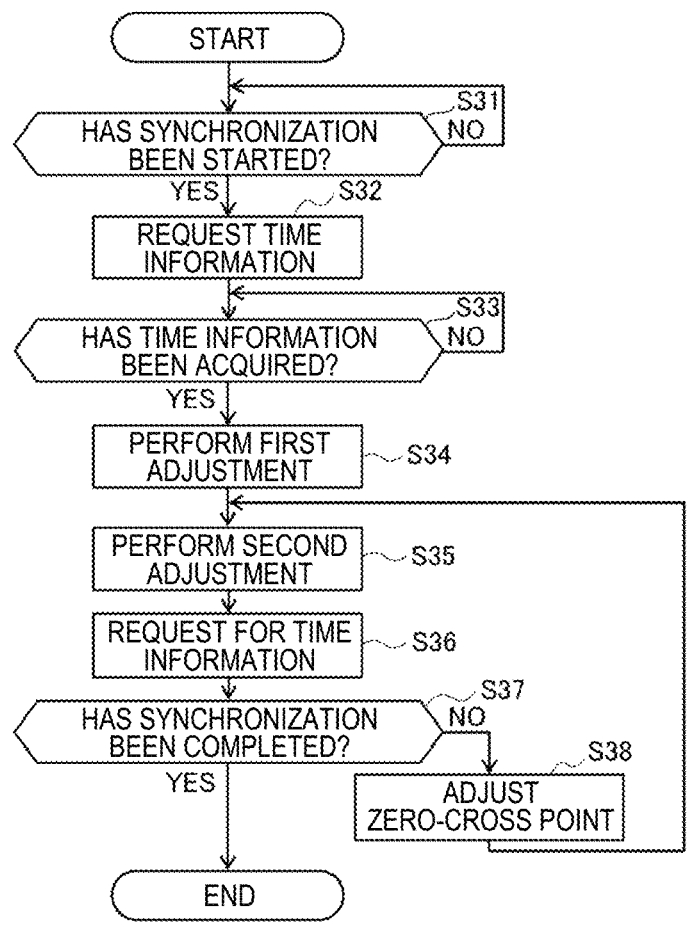
FIG. 9 is a flowchart illustrating an example of operations of a measurement device control program.

Next, operations of the time information provision device 1 and the measurement device 2 will be described with reference to FIGS. 7 to 9. FIGS. 7 to 9 are flowcharts illustrating an example of operations of the measurement device control program or the time information provision control program. In description of the flowcharts presented below, although a subject of execution of operations will be described as the time information provision device 1 or the measurement device 2, each of the operations can be executed by each functional unit of each of the devices described above. A subject of operations common to the time information provision device 1 and the measurement device 2 will be described as a "device."

FIG. 7 illustrates operations of sampling waveform data of the time information provision device 1 and the measurement device 2. As illustrated in FIG. 7, the device determines whether or not it is a sampling time (Step S11). The sampling time can be determined whether or not it is a sampling timing (for example, a predetermined zero-cross point) in processing of a sampling slot. When it is determined that it is not a sampling time (Step S11: No), the device repeats the process of Step S11 and waits for a sampling timing.

On the other hand, when it is determined that it is a sampling time (Step S11: Yes), the device samples waveform data (a voltage or current waveform) at a measurement point (Step S12). The device processes the sampled waveform data (Step S13). The device executes the processing of waveform data in a plurality of processing slots. The processing of waveform data, for example, is A/D conversion of analog data, normalization of the waveform data or the like. The device transmits the processed waveform data to the processing device 5 (Step S14) and ends the process represented in the flowchart.

FIG. 8 illustrates a time information provision operation of the time information provision device 1. As illustrated in FIG. 8, the time information provision device 1 determines whether or not a request for provision of time information has been acquired from the measurement device 2 that is communicatively connected through a network (Step S21). When it is determined that a request has not been acquired (Step S21: No), the time information provision device 1 repeats the process of Step S21 and waits for acquisition of the request.

On the other hand, when it is determined that the request has been acquired (Step S21: Yes), the time information provision device 1 generates item information based on the processing timing of the processing slot that is currently being executed (Step S22). The time information provision device 1 provides the generated time information for the measurement device 2 (Step S23) and ends the process illustrated in the flowchart.

FIG. 9 illustrates a processing timing synchronization operation of the measurement device 2. The measurement device 2 determines whether or not synchronization of processing timings is started (Step S31). For example, the start of synchronization is performed when power of the measurement device 2 is input or when a reset operation is performed. When it is determined that synchronization is not started (Step S31: No), the measurement device 2 repeats the process of Step S31 and waits for the start of synchronization.

On the other hand, when it is determined that synchronization has been started (Step S31: Yes), the measurement device 2 requests the time information provision device 1, which is communicatively connected through a network, to provide time information (Step S32). For example, the network is an Internet Protocol (IP) network. The measurement device 2, for example, transmits a command (for example, a PING command) used for checking reachability of a node to the IP network and requests an IP address of a device, which has responded, to provide time information. The measurement device 2 determines whether or not the time information has been acquired (Step S33). When a device that has requested for the provision of time information is the time information provision device 1, the measurement device 2 can acquire time information as described with reference to FIG. 8. When it is determined that time information has not been acquired (Step S33: No), the measurement device 2 waits for acquisition of time information until timeout.

On the other hand, when it is determined that time information has been acquired (Step S33: Yes), the measurement device 2 adjusts the processing timing of the processing in the processing slot (first adjustment) using the first adjustment unit 25 on the basis of the time information acquired by the time information acquisition unit (Step S34). Next, the measurement device 2 adjusts the processing timing adjusted by the first adjustment unit 25 on the basis of the waveform using the second adjustment unit 26 (second adjustment) (Step S35).

Next, the measurement device 2 requests the time information provision device 1 to provide the time information (Step S36). The process in Step S36 is similar to a process in Step S32.

Next, the measurement device 2 determines whether or not synchronization of the processing timing has been completed (Step S37). Whether synchronization has been completed can be determined based on whether or not the zero-cross point described with reference to FIG. 5 coincides with the time information provision device 1. When it is determined that synchronization of the processing timing has not been completed (Step S37: No), the measurement device 2 adjusts the zero-cross point (Step S38). After execution of the process of Step S38, the measurement device 2 repeats the processes of Steps S35 to S37 again and checks that synchronization has been completed. On the other hand, when it is determined that synchronization of the processing timing has been completed (Step S37: Yes), the measurement device 2 ends the process illustrated in the flowchart.

The execution order of the processes of the steps of the flowchart illustrated in this example is not particularly limited. For example, as an execution order of processes that can be processed in parallel, any of the processes may be executed first.

Figure 10:
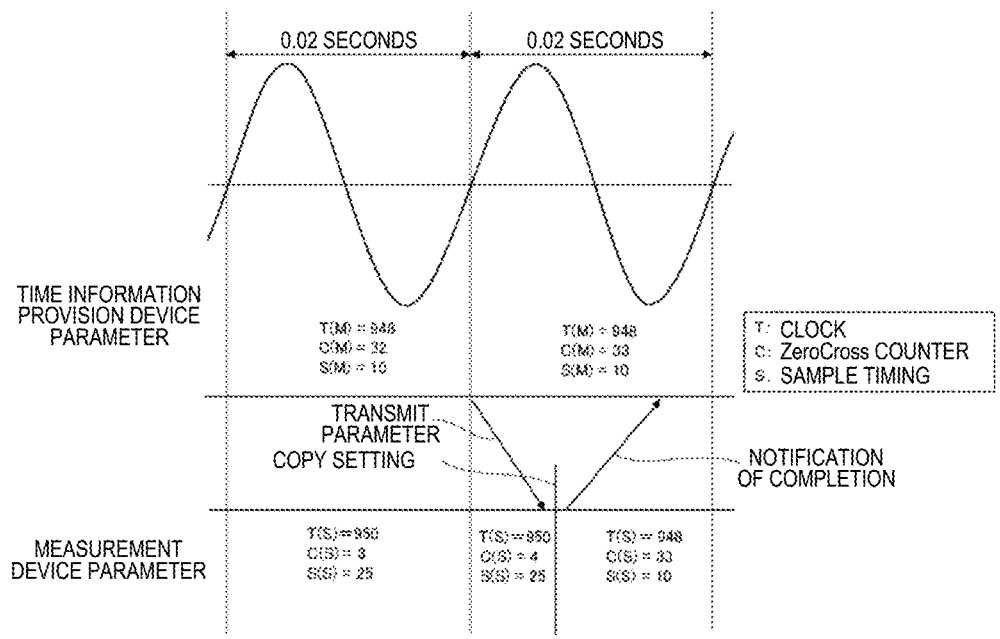
FIG. 10 is a diagram illustrating an example of adjustment of a processing timing of a measurement device.

The adjustment of the processing timing of the measurement device 2 will be described with reference to FIG. 10. FIG. 10 is a diagram illustrating an example of adjustment of the processing timing of the measurement device 2.

FIG. 10 illustrates time information in the time information provision device 1 and time information in the measurement device 2 for two periods (0.02 second×2 periods) of a commercial frequency (50 Hz). T(M), C(M), and S(M) are parameters of the time information in the time information provision device 1. T(S), C(S), and S(S) are parameters of the time information in the measurement device 2.

T(M) is a value of a clock of the time information provision device 1. For example, the value of the clock can be acquired from an internal clock included in the time information provision unit 14. T(S) is a value of a clock of the measurement device 2. For example, the value of the clock can be acquired from an internal clock included in the time information acquisition unit 24.

C(M) is a value of a zero-cross counter that counts zero-cross points at which positivity/negativity of the commercial waveform is inverted in the time information provision device 1. For example, the value of the zero-cross counter can be acquired by counting zero-cross points detected for one second by the processing unit 12. For example, when a commercial frequency is 50 Hz, there are 50 zero-cross points for one second, and thus the value of the zero-cross counter is a value in the range of 0 to 49. Similarly, C(S) is a value of a zero-cross counter that counts zero-cross points at which positivity/negativity of the commercial waveform is inverted in the measurement device 2.

S(M) is a value that represents a sample timing in the time information provision device 1. The sampling timing is a value of a zero-cross counter that represents a waveform start point. S(S) is a value that represents a sampling timing in the measurement device 2.

In a first period (for first 0.02 seconds illustrated in the drawing) of the commercial frequency, the parameters of the time information of the time information provision device 1 are T(M)=948, C(M)=32, and S(M)=10. In addition, in a second period (for second 0.02 seconds illustrated in the drawing) of the commercial frequency, the parameters of the time information of the time information provision device 1 are T(M)=948, C(M)=33, and S(M)=10. In other words, in one period of the commercial frequency, the zero-cross counter of the time information provision device 1 is incremented by "1."

In the first period of the commercial frequency, the time information of the measurement device 2 is T(S)=950, C(S)=3, and S(S)=25. In other words, in the first period, it is assumed that a deviation between the time information of the time information provision device 1 and the time information of the measurement device 2 occurs. In the second period of the commercial frequency, the time information of the measurement device 2 is T(S)=950, C(S)=4, and S(S)=25.

At a zero-cross point at which the second period starts, the time information of the time information provision device 1 transmits the parameters of the time information to the measurement device 2. The measurement device 2 acquires the transmitted parameters and copies and sets the acquired parameters in its own time information. Thus, the parameters of the time information of the measurement device 2 become T(S)=948, C(S)=33, and S(S)=10, which are the same values as those of the time information provision device 1, and the processing timing is adjusted.

After setting the parameters of the time information of the measurement device 2, a completion notification indicating completion of setting of the parameters is transmitted to the time information provision device 1. By receiving the completion notification, the time information provision device 1 can recognize that the setting of the parameters in the measurement device 2 is successful. When a completion notification is not received within a predetermined time after transmission of the parameters of the time information, the time information provision device 1 may be configured to execute an error process. For example, the error process is re-transmission of the parameters of the time information, recording or notification of an occurrence of error or the like. When a completion notification is received within one period (within 0.02 seconds) of the commercial frequency from transmission of the time information, the time information provision device 1 can check that the transmitted time information has been correctly set in the measurement device 2 within the range of the same period.

In the adjustment of the processing timing illustrated in FIG. 10, the time information provision device 1 transmits time information at a zero-cross point at which the second period starts as described above, and thus a timing at which time information is set by the measurement device 2 needs to be within one period of the commercial frequency from transmission of the time information. In other words, a communication delay between the time information provision device 1 and the measurement device 2 needs to be within at least one period of the commercial frequency. For example, the measurement device 2 may measure a communication delay by transmitting a PING command and measuring a response time from the time information provision device 1 and determine whether or not the adjustment of the processing timing illustrated in FIG. 10 can be executed.

By recording a program to realize the functions configuring the devices described in this example in a computer-readable recording medium and causing a computer system to read and execute the program recorded in this recording medium, above-described various processes according to this example may be performed. The "computer system" described here includes an operating system (OS) and hardware such as peripherals. In addition, when a WWW system is used, "computer system" also includes a home page providing environment (or a display environment). Furthermore, the "computer-readable recording medium" represents a writable nonvolatile memory such as a flexible disk, a magneto-optical disk, a ROM, or a flash memory, a portable medium such as a CD-ROM, or a storage device such as a hard disk built into the computer system.

In addition, the "computer-readable recording medium" includes a medium storing the program for a predetermined time such as an internal volatile memory (for example, a Dynamic Random Access Memory (DRAM)) of a computer system serving as a server or a client when the program is transmitted through a network such as the Internet or a communication line such as a telephone line. In addition, the program described above may be transmitted from a computer system storing this program in a storage device or the like to another computer system through a transmission medium or a transmission wave in a transmission medium. The "transmission medium" transmitting a program represents a medium having an information transmitting function such as a network (communication network) including the Internet and the like or a communication line (communication wire) including a telephone line. The program described above may be used for realizing a part of the functions described above. In addition, the program described above may be a program realizing the functions described above by being combined with a program recorded in the computer system in advance, that is, a so-called a differential file (differential program).

Relating to the examples described above, the following supplements will be further disclosed.

Supplement 1

A measurement device includes: a sampling unit configured to sample a waveform of at least one of a voltage and a current at a measurement point of a power line at a predetermined sampling timing; a processing unit configured to execute processing of the waveform sampled by the sampling unit in a plurality of processing slots; a time information requesting unit configured to request a time information provision device, which is communicatively connected through a network, to provide time information; a time information acquisition unit configured to acquire the time information provided from the time information provision device in response to the request; a first adjustment unit configured to adjust a processing timing of the processing in the processing slots on the basis of the time information acquired by the time information acquisition unit; and a second adjustment unit configured to adjust the processing timing adjusted by the first adjustment unit on the basis of the waveform.

Supplement 2

In the measurement device described in Supplement 1, the time information requesting unit searches for the time information provision device connected to the network and requests the time information provision device, which has been retrieved, to provide time information.

Supplement 3

In the measurement device described in Supplement 1 or 2, the time information requesting unit requests the time information provision device sampling a waveform of at least one of a voltage and a current at another measurement point of the power line to provide time information.

Supplement 4

In the measurement device described in any one of Supplements 1 to 3, the second adjustment unit adjusts the processing timing using a zero-cross point at which positivity/negativity of the waveform is inverted as a reference.

Supplement 5

In the measurement device described in any one of Supplements 1 to 4, the processing unit at least includes a processing slot for sampling the waveform in the sampling unit.

Supplement 6

A time information provision device includes: a sampling unit configured to sample a waveform of at least one of a voltage and a current at a measurement point of a power line at a predetermined sampling timing; a processing unit configured to execute processing of the waveform sampled by the sampling unit in a plurality of processing slots; a request acquisition unit configured to acquire a request for provision of time information from a measurement device that is communicatively connected through a network; and a time information provision unit configured to provide the time information based on a processing timing of the processing in the processing slots in response to the request.

Supplement 7

In the time information provision device described in Supplement 6, the request acquisition unit acquires a request for provision of the time information from the measurement device sampling a waveform of at least one of a voltage and a current at another measurement point of the power line.

Supplement 8

In the time information provision device described in Supplement 6 or 7, the sampling unit samples the waveform at a sampling timing using a zero-cross point at which positivity/negativity of the waveform is inverted as a reference.

Supplement 9

In the time information provision device described in any one of Supplements 6 to 8, the processing unit at least includes a processing slot for sampling the waveform in the sampling unit.

Supplement 10

A measurement device control method causes a measurement device to execute: a sampling step of sampling a waveform of at least one of a voltage and a current at a measurement point of a power line at a predetermined sampling timing; a processing step of executing processing of the waveform sampled in the sampling step in a plurality of processing slots; a time information request step of requesting a time information provision device, which is communicatively connected through a network, to provide time information; a time information acquisition step of acquiring the time information provided from the time information provision device in response to the request; a first adjustment step of adjusting a processing timing of the processing in the processing slots on the basis of the time information acquired in the time information acquisition step; and a second adjustment step of adjusting the processing timing adjusted in the first adjustment step on the basis of the waveform.

Supplement 11

A time information provision control method causes a time information provision device to execute: a sampling step of sampling a waveform of at least one of a voltage and a current at a measurement point of a power line at a predetermined sampling timing; a processing step of executing processing of the waveform sampled in the sampling step in a plurality of processing slots; a request acquisition step of acquiring a request for provision of time information from a measurement device that is communicatively connected through a network; and a time information provision step of providing the time information based on a processing timing of the processing in the processing slots in response to the request.

Supplement 12

A measurement device control program causes a measurement device to execute: a sampling process of sampling a waveform of at least one of a voltage and a current at a measurement point of a power line at a predetermined sampling timing; a processing process of executing processing of the waveform sampled in the sampling process in a plurality of processing slots; a time information request process of requesting a time information provision device, which is communicatively connected through a network, to provide time information; a time information acquisition process of acquiring the time information provided from the time information provision device in response to the request;

a first adjustment process of adjusting a processing timing of the processing in the processing slots on the basis of the time information acquired in the time information acquisition process; and a second adjustment process of adjusting the processing timing adjusted in the first adjustment process on the basis of the waveform.

Supplement 13

A time information provision control program causes a time information provision device to execute: a sampling process of sampling a waveform of at least one of a voltage and a current at a measurement point of a power line at a predetermined sampling timing; a processing process of executing processing of the waveform sampled in the sampling process in a plurality of processing slots; a request acquisition process of acquiring a request for provision of time information from a measurement device that is communicatively connected through a network; and a time information provision process of providing the time information based on a processing timing of the processing in the processing slots in response to the request.

As above, although the examples have been described with reference to the drawings, a specific configuration is not limited to the examples, and various changes in a range not departing from the concepts of this disclosure are included therein.

The invention claimed is:

1. A measurement device comprising:
a sampling unit configured to sample a waveform of at least one of a voltage and a current at a measurement point of a power line at a predetermined sampling timing;
a processing unit configured to execute processing of the waveform sampled by the sampling unit in a plurality of processing slots repeatedly with a predetermined period in synchronization with the waveform;
a time information requesting unit configured to request a time information provision device, which is communicatively connected through a network, to provide time information;
a time information acquisition unit configured to acquire the time information provided from the time information provision device in response to the request; and
an adjustment unit configured to adjust a processing timing of the processing in the processing slots on the basis of the time information acquired by the time information acquisition unit and the waveform so that the time information provision device and the measurement device assume a synchronized state from an unsynchronized state.

2. The measurement device according to claim 1, wherein the time information acquisition unit acquires at least a value of a clock of the time information provision device and a value of a zero-cross counter counting zero-cross points at which positivity/negativity of the waveform is inverted in the time information provision device as the time information.

3. The measurement device according to claim 2, wherein the time information acquisition unit acquires the time information from the time information provision device sampling a waveform of at least one of a voltage and a current at another measurement point of the power line.

4. The measurement device according to claim 3, wherein the adjustment unit adjusts the processing timing using a zero-cross point at which positivity/negativity of the waveform is inverted as a reference.

5. The measurement device according to claim 3, wherein the processing unit samples the waveform in the sampling unit.

6. The measurement device according to claim 2, wherein the adjustment unit adjusts the processing timing using a zero-cross point at which positivity/negativity of the waveform is inverted as a reference.

7. The measurement device according to claim 2, wherein the processing unit samples the waveform in the sampling unit.

8. The measurement device according to claim 1, wherein the time information acquisition unit acquires the time information from the time information provision device sampling a waveform of at least one of a voltage and a current at another measurement point of the power line.

9. The measurement device according to claim 8, wherein the adjustment unit adjusts the processing timing using a zero-cross point at which positivity/negativity of the waveform is inverted as a reference.

10. The measurement device according to claim 8, wherein the processing unit samples the waveform in the sampling unit.

11. The measurement device according to claim 1, wherein the adjustment unit adjusts the processing timing using a zero-cross point at which positivity/negativity of the waveform is inverted as a reference.

12. The measurement device according to claim 1, wherein the processing unit samples the waveform in the sampling unit.

13. A measurement system comprising: a measurement device comprising:
a sampling unit configured to sample a waveform of at least one of a voltage and a current at a measurement point of a power line at a predetermined sampling timing;
a processing unit configured to execute processing of the waveform sampled by the sampling unit in a plurality of processing slots repeatedly with a predetermined period in synchronization with the waveform;
a time information requesting unit configured to request a time information provision device, which is communicatively connected through a network, to provide time information;
a time information acquisition unit configured to acquire the time information provided from the time information provision device in response to the request; and
an adjustment unit configured to adjust a processing timing of the processing in the processing slots on the basis of the time information acquired by the time information acquisition unit and the waveform so that the time information provision device and the measurement device assume a synchronized state from an unsynchronized state; and
a time information provision device comprising:
a sampling unit configured to sample a waveform of at least one of a voltage and a current at a measurement point of a power line at the predetermined sampling timing;
a processing unit configured to execute processing of the waveform sampled by the sampling unit in a plurality of processing slots repeatedly with a predetermined period in synchronization with the waveform;
a request acquisition unit configured to acquire a request for provision of time information from the measurement device that is communicatively connected through a network; and a time information provision unit configured to provide the time information based on a processing timing of the processing for the measurement device in the processing slots in response to the request.

14. The measurement system according to claim 13, wherein the time information provision unit provides the time information for the measurement device sampling a waveform of at least one of a voltage and a current at another measurement point of the power line.

15. The measurement system according to claim 13, wherein the sampling unit samples the waveform at a sampling timing using a zero-cross point at which positivity/negativity of the waveform is inverted as a reference.

16. The measurement system according to claim 13, wherein the processing unit samples a waveform in the sampling unit.

17. A measurement device control method causing a measurement device to execute:
    a sampling step of sampling a waveform of at least one of a voltage and a current at a measurement point of a power line at a predetermined sampling timing;
    a processing step of executing processing of the waveform sampled in the sampling step in a plurality of processing slots repeatedly with a predetermined period in synchronization with the waveform;
    a time information requesting step of requesting a time information provision device, which is communicatively connected through a network, to provide time information;
    a time information acquisition step of acquiring the time information provided from the time information provision device in response to the request; and
    an adjustment step of adjusting a processing timing of the processing in the processing slots on the basis of the time information acquired in the time information acquisition step and the waveform so that the time information provision device and the measurement device assume a synchronized state from an unsynchronized state.

18. A measurement control method causing: a measurement device to execute:
    a sampling step of sampling a waveform of at least one of a voltage and a current at a measurement point of a power line at a predetermined sampling timing;
    a processing step of processing of the waveform sampled by the sampling unit in a plurality of processing slots repeatedly with a predetermined period in synchronization with the waveform;
    a time information requesting step of requesting a time information provision device, which is communicatively connected through a network, to provide time information;
    a time information acquisition step of acquiring the time information provided from the time information provision device in response to the request; and
    an adjustment step of adjusting a processing timing of the processing in the processing slots on the basis of the time information acquired by the time information acquisition step and the waveform so that the time information provision device and the measurement device assume a synchronized state from an unsynchronized state; and
    a time information provision device to execute:
    a sampling step of sampling a waveform of at least one of a voltage and a current at a measurement point of a power line at the predetermined sampling timing;
    a processing step of executing processing of the waveform sampled in the sampling step in a plurality of processing slots repeatedly with a predetermined period in synchronization with the waveform;
    a request acquisition step of acquiring a request for provision of the time information from the measurement device that is communicatively connected through a network; and
    a time information provision step of providing the time information based on a processing timing of the processing for the measurement device in the processing slots in response to the request.

19. A non-transitory computer readable medium recording a measurement device control program causing a measurement device to execute:
    a sampling process of sampling a waveform of at least one of a voltage and a current at a measurement point of a power line at a predetermined sampling timing;
    a processing process of executing processing of the waveform sampled in the sampling process in a plurality of processing slots repeatedly with a predetermined period in synchronization with the waveform;
    a time information requesting process of requesting a time information provision device, which is communicatively connected through a network, to provide time information;
    a time information acquisition process of acquiring the time information provided from the time information provision device in response to the request; and
    an adjustment process of adjusting a processing timing of the processing in the processing slots on the basis of the time information acquired in the time information acquisition process and the waveform so that the time information provision device and the measurement device assume a synchronized state from an unsynchronized state.

20. A non-transitory computer readable medium recording a measurement control program causing:
    a measurement device to execute:
    a sampling process of sampling a waveform of at least one of a voltage and a current at a measurement point of a power line at a predetermined sampling timing;
    a processing process of processing of the waveform sampled by the sampling unit in a plurality of processing slots repeatedly with a predetermined period in synchronization with the waveform;
    a time information requesting process of requesting a time information provision device, which is communicatively connected through a network, to provide time information;
    a time information acquisition process of acquiring the time information provided from the time information provision device in response to the request; and
    an adjustment process of adjusting a processing timing of the processing in the processing slots on the basis of the time information acquired by the time information acquisition unit and the waveform so that the time information provision device and the measurement device assume a synchronized state from an unsynchronized state; and
    a time information provision device to execute:
    a sampling process of sampling a waveform of at least one of a voltage and a current at a measurement point of a power line at the predetermined sampling timing;
    a processing process of executing processing of the waveform sampled in the sampling process in a plurality of processing slots repeatedly with a predetermined period in synchronization with the waveform;

a request acquisition process of acquiring a request for provision of the time information from the measurement device that is communicatively connected through a network; and a time information provision process of providing the time information based on a processing timing of the processing for the measurement device in the processing slots in response to the request.

* * * * *